United States Patent
Ding et al.

(10) Patent No.: US 9,024,689 B2
(45) Date of Patent: May 5, 2015

(54) ELECTRONIC SYSTEM—RADIO FREQUENCY POWER AMPLIFIER AND METHOD FOR SELF-ADJUSTING BIAS POINT

(71) Applicant: Advanced Semiconductor Engineering Inc., Kaohsiung (TW)

(72) Inventors: Jaw-Ming Ding, Taoyuan County (TW); Chien-Yeh Liu, Hsinchu County (TW)

(73) Assignee: Advanced Semiconductor Engineering Inc., Kaohsiung (TW)

( * ) Notice: Subject to any disclaimer, the term of this patent is extended or adjusted under 35 U.S.C. 154(b) by 0 days.

(21) Appl. No.: 14/083,633

(22) Filed: Nov. 19, 2013

(65) Prior Publication Data

US 2014/0167854 A1    Jun. 19, 2014

(30) Foreign Application Priority Data

Dec. 19, 2012   (TW) .............................. 101148311 A

(51) Int. Cl.
| | |
|---|---|
| H03G 3/10 | (2006.01) |
| H03F 1/02 | (2006.01) |
| H03F 1/30 | (2006.01) |
| H03F 1/32 | (2006.01) |
| H03F 1/56 | (2006.01) |
| H03F 3/195 | (2006.01) |
| H03F 3/24 | (2006.01) |

(52) U.S. Cl.
CPC .............. *H03F 1/0272* (2013.01); *H03F 1/302* (2013.01); *H03F 1/32* (2013.01); *H03F 1/56* (2013.01); *H03F 3/195* (2013.01); *H03F 3/245* (2013.01); *H03F 2200/18* (2013.01); *H03F 2200/222* (2013.01); *H03F 2200/387* (2013.01)

(58) Field of Classification Search
CPC .................................... H03F 3/04; H03G 3/10
USPC .......................................... 330/285, 296, 261
See application file for complete search history.

(56) References Cited

U.S. PATENT DOCUMENTS

| | | | | |
|---|---|---|---|---|
| 7,365,604 B2 * | 4/2008 | Luo et al. | ....................... | 330/296 |
| 7,522,001 B2 * | 4/2009 | Yamamoto et al. | ........... | 330/285 |
| 7,605,651 B2 * | 10/2009 | Ripley et al. | ................... | 330/133 |
| 8,179,648 B1 * | 5/2012 | Loeb et al. | ....................... | 361/56 |
| 8,432,228 B1 * | 4/2013 | Dolin | ............................ | 330/297 |
| 8,890,617 B2 * | 11/2014 | Marra et al. | .................... | 330/285 |

* cited by examiner

*Primary Examiner* — Henry Choe
(74) *Attorney, Agent, or Firm* — Foley & Lardner LLP; Cliff Z. Liu; Angela D. Murch

(57) ABSTRACT

A radio frequency (RF) power amplifier is disclosed. The RF power amplifier includes a bias circuit, an output stage circuit and dynamic bias controlling circuit. The bias circuit receives a system voltage and the bias circuit provides a working voltage according to the system voltage. The output stage circuit receives the working voltage so as to work at an operation bias point. The dynamic bias controlling circuit receives the working voltage and outputs a compensation voltage to the bias circuit according to a variation of the working voltage. When the input power increases and makes the working voltage decreases so as to shift the operation bias point, the bias circuit adjusts the working voltage upward so as to recover the operation bias point according to the compensation voltage received.

9 Claims, 5 Drawing Sheets

ELECTRONIC SYSTEM—RADIO FREQUENCY POWER AMPLIFIER AND METHOD FOR SELF-ADJUSTING BIAS POINT

BACKGROUND OF THE INVENTION

1. Field of the Invention

The instant disclosure relates to a RF power amplifier; in particular, to a RF amplifier which can self-adjust a bias point.

2. Description of Related Art

With the Internet well developed, people are used to receiving mass information fast, especially because the wireless communication technology has developed in recent years and many kinds of personal mobile products are blooming such as the mobile phone, the Personal Digital Assistance (PDA) and the like, people tend to have the real-time on-line support in addition to capturing the real-time information. Therefore, the combination of the Internet, the Wireless Local Area Network (WLAN) regarding to the wireless communication and the 3rd-Generation (4G) and $4^{th}$-Generation (4G) mobile communication technologies becomes needed.

A RF power amplifier plays an extremely important role in the communication system. In order to have better Power Added Efficiency (PAE), a linear RF power amplifier usually prefers to the class AB operation. Generally speaking, when a RF input power increases, an average voltage drop of the forward biased junction of an amplification transistor decreases and the RF power amplifier is forced to the class B operation and even the class C operation, so that the output power of the amplification transistor becomes saturated and the output signal gradually becomes non-linear.

In other words, in a transmitter, the RF power amplifier is an element having the most power consumption, of which the Power Added Efficiency (PAE) directly affects the battery life. A direct current bias of the class AB can improve the Power Added Efficiency (PAE) of the power amplifier, because it has a lower level quiescent current, which is, the bias current with zero input power. However, when the input power of the amplifier increases to certain level, the load line used in the class AB amplifier may enter into a cut-off region, which further results in a gain compression making the output power saturated. When the input power of the class AB amplifier increases to certain level, the gain compression mechanism in the cut-off region restricts the power gain and the output power of the class AB amplifier, because the direct current operating point is near the cut-off region.

SUMMARY OF THE INVENTION

The instant disclosure provides a RF power amplifier, receiving and amplifying a RF input signal. The RF power amplifier comprises a bias circuit, an output-stage circuit, and a dynamic bias controlling circuit. The bias circuit receives a system voltage and the bias circuit provides a work voltage according to the system voltage. The output-stage circuit is electrically connected to the bias circuit and receives the work voltage for operating at an operation bias point. The dynamic bias controlling circuit receives the work voltage and outputs a compensation voltage to the bias circuit according to a change of the work voltage. When an input power of the RF input signal increases such that the work voltage decreases and the operation bias point offsets, the work voltage is increased by the bias circuit according to the compensation voltage received so as to recover the operation bias point.

In an embodiment of the instant disclosure, the bias circuit comprises a first transistor, a second transistor, a reference current source, a first resistor, and a second resistor. A base of the first transistor is connected to the dynamic bias controlling circuit and receives the compensation voltage, and an emitter of the first transistor is connected to the ground voltage. A base of the second transistor is connected to a collector of the first transistor and a collector of the second transistor is connected to the system voltage. One terminal of the reference current source is connected to the collector of the first transistor and another terminal of the reference current source is connected to the system voltage so as to provide a reference current. One terminal of the first resistor is connected to an emitter of the second transistor and another terminal of the first resistor is connected to the dynamic bias controlling circuit. One terminal of the second resistor is connected to the emitter of the second transistor and another terminal of the second resistor is connected to the dynamic bias controlling circuit so as to output the work voltage. The reference current is equal to a sum of a collector current of the first transistor and a base current of the second transistor.

In an embodiment of the instant disclosure, when the input power increases such that the work voltage decreases, the base of the first transistor receives the compensation voltage and accordingly the base current and the collector current of the first transistor decrease, such that the base current and the emitter current of the second transistor increase so as to increase the work voltage and recover the operation bias point.

In an embodiment of the instant disclosure, the output-stage circuit comprises a third transistor. A base of the third transistor receives the work voltage, an emitter of the third transistor is connected to the ground voltage, and a collector of the third transistor is connected to the system voltage.

In an embodiment of the instant disclosure, the dynamic bias controlling circuit comprises a third resistor and a first capacitor. One terminal of the third resistor is connected between the bias circuit and the output-stage circuit, and the third resistor receives the work voltage. One terminal of the first capacitor is connected to another terminal of the third resistor, and another terminal of the first capacitor is connected to the ground voltage.

The instant disclosure further provides an electronic system. The electronic system comprises a RF amplifier and a load. The RF amplifier receives a RF input signal and outputs a RF output signal. The load is connected to the RF power amplifier, and the load receives the RF output signal. When the RF input signal increases, the RF power amplifier stabilizes the operation bias point via the compensation circuit.

In an embodiment of the instant disclosure, the bias circuit comprises a first transistor, a second transistor, a reference current source, a first resistor, and a second resistor. A base of the first transistor is connected to the dynamic bias controlling circuit and receives the compensation voltage, and an emitter of the first transistor is connected to the ground voltage. A base of the second transistor is connected to a collector of the first transistor and a collector of the second transistor is connected to the system voltage. One terminal of the reference current source is connected to the collector of the first transistor and another terminal of the reference current source is connected to the system voltage, and the reference current source provides a reference current. One terminal of the first resistor is connected to an emitter of the second transistor, and another terminal of the first resistor is connected to the dynamic bias controlling circuit. One terminal of the second resistor is connected to the emitter of the second transistor, and another terminal of the second resistor is connected to the dynamic bias controlling circuit and outputs the work voltage. The reference current is equal to a sum of the collector current of the first transistor and the base current of the second transistor. when the input power increase such that the work voltage decrease, the base of the first transistor receives the compensation voltage so that base current and collector current of the first transistor decrease, and thus base current and emitter current of the second transistor increase so as to increase the work voltage for recovering the operation bias point.

In an embodiment of the instant disclosure, the dynamic bias controlling circuit comprises a third transistor and a first capacitor. One terminal of the third transistor is connected between the bias circuit and the output-stage circuit, and receives the work voltage. One terminal of the first capacitor is connected to another terminal of the third resistor, and another terminal of the first capacitor is connected to the ground voltage.

The instant disclosure further provides a method for self-adjusting bias point. The method for self-adjusting bias point comprises steps as below: receiving a system voltage via a bias circuit and accordingly providing a work voltage; receiving the work voltage via an output-stage circuit and accordingly operating at an operation bias point; and receiving the work voltage via a dynamic bias controlling circuit and outputting a compensation voltage so as to stabilize the operation bias point according to change of the work voltage. When the input power increases and the work voltage decreases such that the operation bias point offsets, the work voltage is increased by the bias circuit via the compensation voltage received so as to recover the operation bias point.

To sum up, in the electronic system, the RF power amplifier, and the method for self-adjusting bias point provided by the instant disclosure, when the input power increases, the gain compression resulted from the fact that the operation bias point of the RF power amplifier offsets into a cut-off region can be avoided so as to prevent the output power from being saturated. In other words, the instant disclosure dynamically controls the operation bias point of the RF power amplifier so as to decrease the offset resulted from a change of the input power. Further, the embodiment of the instant disclosure can improve the linearity of the RF power amplifier during the power transformation so as to decrease the signal distortion and provide more extended ranges of the input power and the output power in order to be satisfied with the linearity required by the system.

For further understanding of the instant disclosure, reference is made to the following detailed description illustrating the embodiments and examples of the instant disclosure. The description is only for illustrating the instant disclosure, not for limiting the scope of the claim.

BRIEF DESCRIPTION OF THE DRAWINGS

Embodiments are illustrated by way of example and not by way of limitation in the figures of the accompanying drawings, in which like references indicate similar elements and in which.

DETAILED DESCRIPTION OF PREFERRED EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings.

It will be understood that, although the terms first, second, third, and the like, may be used herein to describe various elements, components, regions, layers and/or sections, these elements, components, regions, layers and/or sections should not be limited by these terms. These terms are only to distinguish one element, component, region, layer or section from another region, layer or section discussed below could be termed a second element, component, region, layer or section without departing from the teachings of the present disclosure. As used herein, the term "and/or" includes any and all combinations of one or more of the associated listed items.

The instant disclosure provides a RF power amplifier which can self-adjust the operation bias point. Via the dynamic adjusting technology, the operation bias point of the RF power amplifier is adjusted and stabilized so as to prevent from a gain compression resulted when an input power increases and the operation bias point enters into a cut-off region. In other words, in order to satisfy a required linearity of the RF power amplifier by the system, the instant disclosure provides an output with a high linearity and a high efficiency and further provides larger ranges of the input power and the output power. To more clearly understand the instant disclosure, at least one embodiment is provided below to disclose or teach the working mechanism of a RF amplifier for self-adjusting the operation bias point.

[One Embodiment of a RF Power Amplifier]

Figure 1:
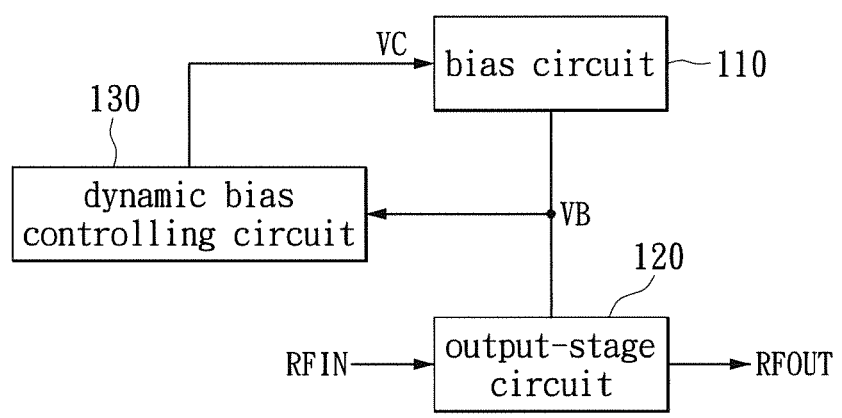
FIG. 1 shows a circuit diagram of a schematic block diagram of a RF power amplifier according to an embodiment of the instant disclosure.

Please refer to FIG. 1, FIG. 1 shows a circuit diagram of a schematic block diagram of a RF power amplifier according to an embodiment of the instant disclosure. As shown in FIG. 1, a RF power amplifier 100 comprises a bias circuit 110, an output-stage circuit 120 and a dynamic bias controlling circuit 130. The output-stage circuit 120 is electrically connected to the bias circuit 110. The dynamic bias controlling circuit 130 is electrically connected to the bias circuit 110.

In the present embodiment, the bias circuit 110 receives a system voltage VCC and the bias circuit 110 provides a work voltage VB to the output-stage circuit 120 according to the system voltage VCC, such that the output-stage circuit 120 operates at a proper bias point. The output-stage circuit 120 receives the work voltage VB so as to operate at an operation bias point the designer may prefer. The dynamic bias controlling circuit 130 receives the work voltage VB and outputs a compensation voltage VC to the bias circuit 110 according to a change of the work voltage VB. When an input power of a RF input signal RFIN increases and the work voltage VB decreases such that the operation bias point offsets, the bias circuit 110 increases the work voltage VB according to the compensation voltage VC received, in order to recover the operation bias point.

In the following description is further instruction in teaching a working mechanism of the RF power amplifier 100.

Please still refer to FIG. 1, in the wireless communication system, the RF power amplifier 100 is used for increasing an output power of a transmitter, so the RF power amplifier 100 has to provide an output power with a high linearity and a high efficiency with limited power consumption so as to satisfy the high linearity of the RF power amplifier 100 required by the system. In a direct current (DC) working mode, the bias circuit 110 generates a work voltage VB via an electrical connection to a system voltage VCC, and the RF power amplifier 100 works at an operation bias point via the work voltage VB provided by the bias circuit 110. In an alternating current (AC) mode, the output-stage circuit 120 receives and amplifies a RF input signal RFIN, and outputs a RF output signal RFOUT. However, when an input power of the RF input signal RFIN is growing increasingly, a work voltage of the output-stage circuit 120 gradually decreases, such that the operation bias point of the output-stage circuit 120 enters into a cut-off region and a gain compression is resulted. The gain compression makes the overall output power of the RF power amplifier 100 be saturated and further decreases the working efficiency and the linearity of the RF power amplifier 100.

Therefore, in the present embodiment, the RF power amplifier 100 stabilizes the operation bias point of the output-stage circuit 120 via the dynamic bias controlling circuit 130. When the work voltage VB gradually decreases with the increase of the input power, the dynamic bias controlling circuit 130 detects a change of the work voltage VB and further generates a compensation voltage VC to the bias circuit 110 in order to adjust the work voltage outputted by the bias circuit 110. The bias circuit 110 increases the work voltage VB according to the compensation voltage VC received so as to recover the operation bias point of the output-stage circuit 120.

Accordingly, via the mechanism for dynamically adjusting operation bias point, the operation bias point of the RF power amplifier 100 does not offset to enter into a cut-off region with the increase of the input power of the RF input signal and there is no gain compression resulted. In other words, the instant disclosure can dynamically self-adjust the operation bias point of the RF power amplifier 100 so as to decrease the offset of the operation bias point with the change of the input power. The embodiment of the instant disclosure is able to improve the linearity of the RF power amplifier 100 during the power transformation so as to decrease the signal distortion in order to provide a high working efficiency and a high linearity that required by the system.

For a specific instruction on an operation process of the RF power amplifier 100 of the instant disclosure, there is at least one of the embodiments for further instruction.

In the following embodiments, there are only parts different from embodiments in FIG. 1 described, and the omitted parts are indicated to be identical to the embodiments in FIG. 1. In addition, for an easy instruction, similar reference numbers or symbols refer to elements alike.

[Another Embodiment of a RF Power Amplifier]

Figure 2:
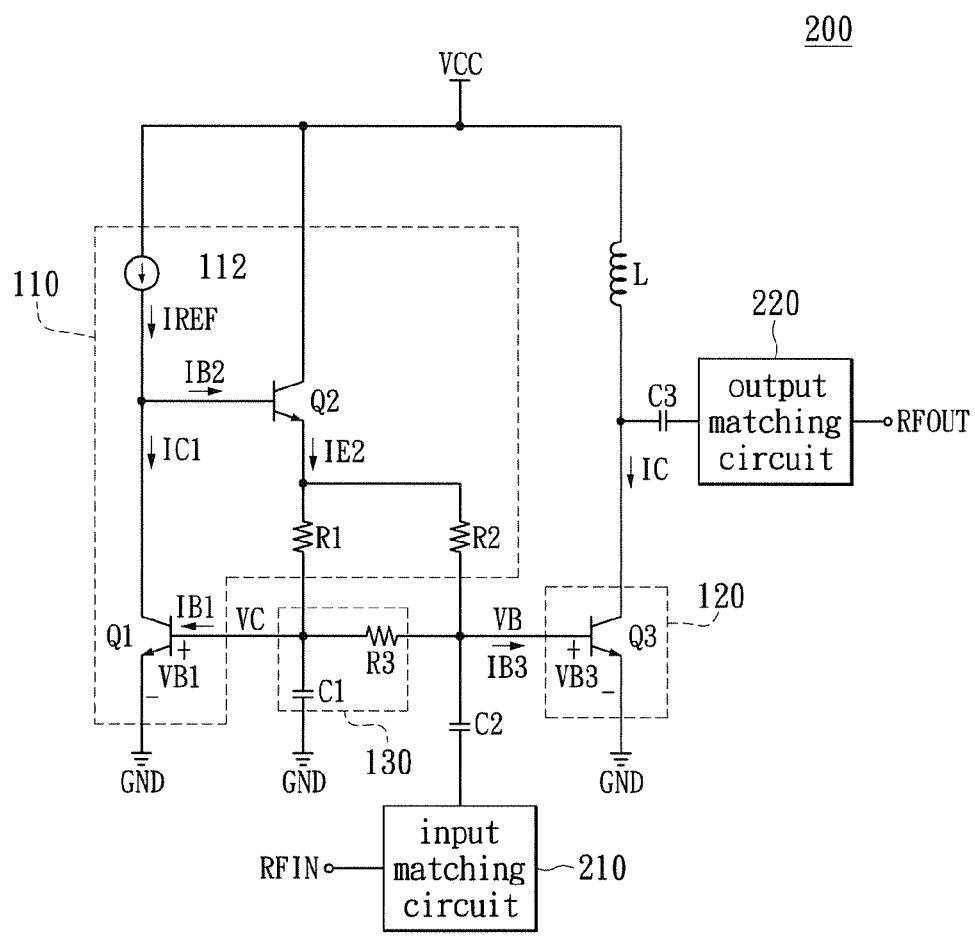
FIG. 2 shows a perspective diagram of a detailed circuit diagram of a RF power amplifier according to an embodiment of the instant disclosure.

Please refer to FIG. 2, FIG. 2 shows a detailed circuit diagram of a RF power amplifier according to an embodiment of the instant disclosure. Different from the embodiment in FIG. 1, in the present embodiment, the bias circuit 110 comprises a first transistor Q1, a second transistor Q2, a reference current source 112, a first resistor R1 and a second resistor R2. The output-stage circuit 120 comprises a third transistor Q3.

The dynamic bias controlling circuit 130 comprises a third resistor R3 and a first capacitor C1. In the present embodiment, the transistors Q1~Q3 may be consisted of any kind of transistors which are with a gallium arsenide manufacture process, a silicon manufacture process or a silicon germanium manufacture process such as effect transistors (FET), heterojunction bipolar transistors (HBT), or bipolar field effect transistors (BiFET), and thus it is not limited thereto.

A base of the first transistor Q1 is connected to the dynamic bias controlling circuit 130 and receives a compensation voltage VC, and an emitter of the first transistor Q1 is connected to the ground voltage GND. A base of the second transistor Q2 is connected to a collector of the first transistor Q1 and a collector of the second transistor Q2 is connected to a system voltage VCC. One terminal of the reference current source 112 is connected to the collector of the first transistor Q1 and another terminal of the reference current source 112 is connected to the system voltage VCC, and the reference current source 112 provides a reference current IREF. One terminal of the first resistor R1 is connected to an emitter of the second transistor Q2, and another terminal of the first resistor R1 is connected to the dynamic bias controlling circuit 130. One terminal of the second resistor R2 is connected to the emitter of the second transistor Q2, and another terminal of the second resistor R2 is connected to the dynamic bias controlling circuit 130 and outputs a work voltage VB. A base of the third transistor Q3 receives the work voltage VB, an emitter of the third transistor Q3 is connected to the ground voltage GND, and a collector of the third transistor Q3 is connected to the system voltage VCC. One terminal of the first capacitor C1 is connected to another terminal of the third resistor R3, and another terminal of the first capacitor C1 is connected to the ground voltage GND.

In addition, in the circuit topology configurations of transistors disclosed in FIG. 2, when an emitter area of the third transistor Q3 is N times of an emitter area of the first transistor Q1, the resistance of the first resistor R1 is N times of the resistance of the second resistor R2, and the output current IC of the third transistor Q3 is N times of the reference current IRFE, in which N is—greater than 1. The designer determines the value of N according to a circuit designing demand or an actual application demand. Further, in the present embodiment, the input terminal and the output terminal of the output-stage circuit 120 have an input matching circuit 210 and an output matching circuit 220 respectively, so as to provide a higher power matching efficiency, in which the input matching circuit 210 is electrically connected to a base of the third transistor Q3 to receive a RF input signal RFIN, and the output matching circuit 220 is electrically connected to a collector of the third transistor Q3 to output a RF output signal RFOUT.

In the following description is further instruction in teaching a working mechanism of a RF power amplifier 200.

Please still refer to FIG. 2, in the wireless communication system, the RF power amplifier 200 is usually one of the most important core elements, and the linearity and the power efficiency thereof have a decisive effect on the performance and the efficiency of the wireless communication system. The RF power amplifier 200 may be a simple amplifier mainly consisted of an active element to amplify signals and matching circuits of the input terminal and the output terminal to pull up the modulated signals to a proper high level, in which the modulated signals are transmitted afterwards. When the transmitted signals arrive at a receiving terminal via an electric wave transmitting medium, the signal intensity is enough to provide recovery signals for the receiving terminal.

In the present embodiment, in the DC working mode, the bias circuit 110 consisted of the first transistor Q1, the second transistor Q2, the first resistor R1, the second resistor R2 and the reference current source 112 generates a work voltage VB to a base of the third transistor Q3. It is to be noticed that, at this time, the DC voltage level of the work voltage VB is equal to the base-emitter voltage VBE3 of the third transistor Q3. After entering into the AC working mode, the third transistor Q3 receives and amplifies a RF input signal RFIN, and outputs a RF output signal RFOUT. When the input power of the RF input signal RFIN gradually increases, the base-emitter voltage VBE3 of the third transistor Q3 decreases correspondingly (the base current IB3 also decreases) and the work voltage VB decreases synchronously, which further results in an offset of the operation bias point of the third transistor Q3 during a transient process. This embodiment increases the work voltage VB via the dynamic bias controlling circuit 130 so as to recover the operation bias point of the third transistor Q3. Furthermore, the third resistor R3 of the dynamic bias controlling circuit 130 corresponds to a change of the work voltage VB, and further, another terminal of the third resistor R3 generates and transmits a compensation voltage VC to the first transistor Q1. It is to be noticed that, the DC current voltage level of the compensation voltage VC is equal to the base-emitter voltage of the first transistor Q1 (the base current IB1 also decreases).

The collector current is β times of the base current, so when the base current IB1 of the first transistor Q1 decreases, the collector current IC1 of the first transistor Q1 also decreases. Under the circumstance that the reference current IREF provided by the reference current source 112 is constant; which is, the reference current IREF is equal to a sum of the collector current IC1 and the base current IB2 in which β is a current gain of the first transistor Q1. When the collector current IC1 of the first transistor Q1 decreases, the base current IB2 of the second transistor Q2 increases. Afterwards, the base current IB2 of the second transistor Q2 increases, so the emitter current IE2 of the second transistor Q2 increases. After that, part of the emitter current IE2 flows through the second resistor R2, and further increases the work voltage VB transmitted to the third transistor Q3 by the bias circuit 110. From the above, via the negative feedback mechanism inside the RF power amplifier 200, the work voltage VB is dynamically adjusted to maintain a high linearity; which means, the RF power amplifier 200 can adjust and stabilize the operation bias point of the output-stage circuit 120 even with a change of the input power.

There is at least one stimulation waveform regarding to the embodiment shown in FIG. 2 for a further instruction.

Figure 3:
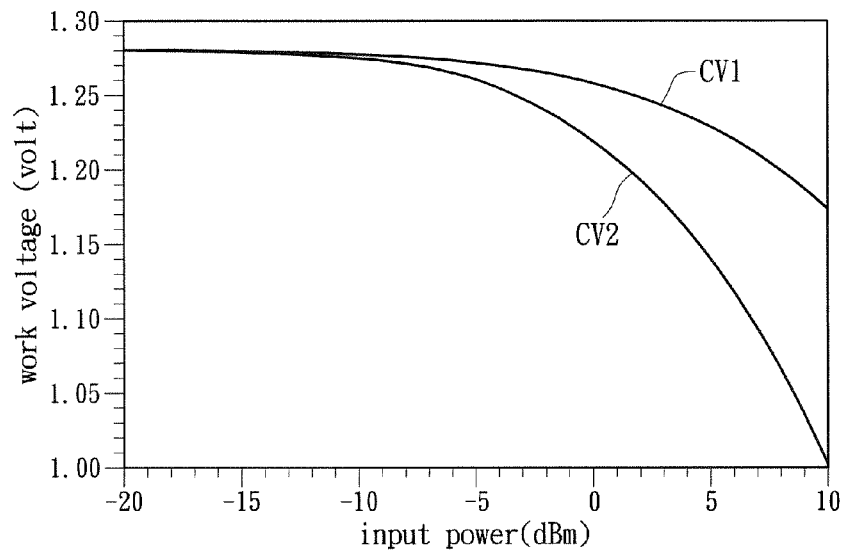
FIG. 3 shows a simulation waveform of a relationship between an input power and a work voltage according to an embodiment of the instant disclosure.

In conjunction with FIGS. 2 and 3. FIG. 3 shows a simulation waveform of a relationship between an input power and a work voltage according to an embodiment of the instant disclosure. In the stimulation waveform of FIG. 3, a horizontal axis represents the input power, whose unit is dBm, and a vertical axis represents the woke voltage, whose unit is volt, wherein a curve CV1 is the stimulated curve of the embodiment shown in FIG. 2 and a curve CV2 is a stimulated curve without the dynamic bias controlling circuit 130 shown in FIG. 2. As shown in FIG. 3, when the input power of the RF input signal RFIN gradually increases, the decrease of the curve CV1 is less than the decrease of the curve CV2, and thus the RF power amplifier 200 with the dynamic bias controlling circuit 130 significantly reduces the possibility that the operation bias point enters into a cut-off region. Afterwards, this embodiment further provides another stimulation waveform regarding to the input power and the output power for a further instruction of the advantages of the instant disclosure.

Figure 4:
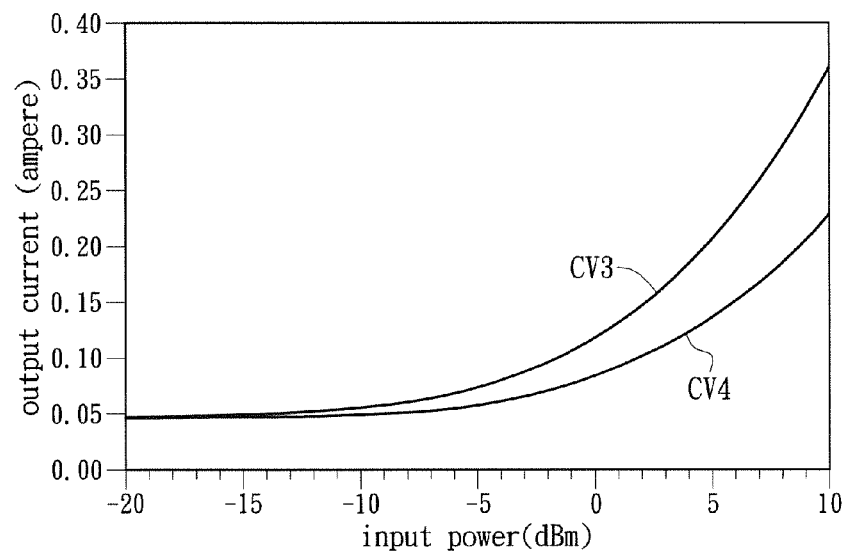
FIG. 4 shows a simulation waveform of a relationship between an input power and a output current according to an embodiment of the instant disclosure.
Figure 5:
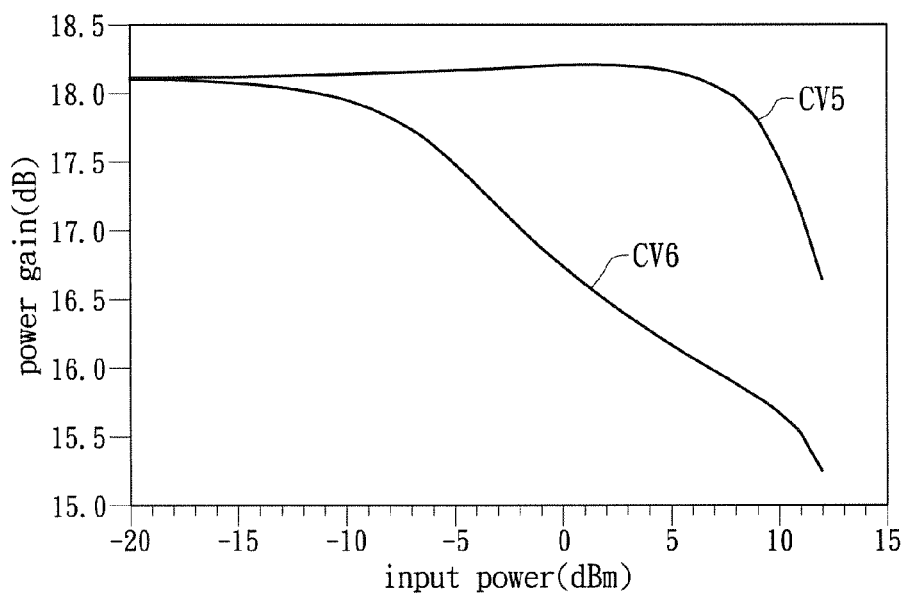
FIG. 5 shows a simulation waveform of a relationship between an input power and a power gain according to an embodiment of the instant disclosure.

In conjunction with FIGS. 2 and 4. FIG. 4 shows a simulation waveform of a relationship between an input power and an output current according to an embodiment of the instant disclosure. In the stimulation waveform of FIG. 4, a horizontal axis represents the input power, whose unit is dBm, and a vertical axis represents the output current, whose unit is ampere, in which the a curve CV3 is the stimulated curve of the embodiment shown in FIG. 2 and a curve CV4 is a stimulated curve without the dynamic bias controlling circuit 130 shown in FIG. 2. As shown in FIG. 4, when the input power of the RF input signal RFIN gradually increases, the increase of the curve CV3 is more than the increase of the curve CV4, and thus with the dynamic bias controlling circuit 130 the RF power amplifier 200 can maintain a high working efficiency and a high linearity. Last but not the least, this embodiment further provides a stimulation waveform regarding to the input power and the power gain for a further instruction of the advantages of the instant disclosure. In conjunction with FIGS. 2 and 5. FIG. 5 shows a simulation waveform of a relationship between an input power and a power gain according to an embodiment of the instant disclosure. In the stimulation waveform of FIG. 5, a horizontal axis represents the input power, whose unit is dBm, and a vertical axis represents the power gain, whose unit is dB, in which the a curve CV5 is the stimulated curve of the embodiment shown in FIG. 2 and a curve CV6 is a stimulated curve without the dynamic bias controlling circuit 130 shown in FIG. 2. Herein, it is clarified that, the power gain is a value of the output power of the third transistor Q3 divided by the input power of the third transistor Q3. As shown in FIG. 5, when the input power of the RF input signal RFIN gradually increases, the power gain regarding to the curve CV5 is better maintained and more stable than the power gain shown by the curve CV6. Thus, when the input power of the RF input signal RFIN gradually increases, the RF power amplifier 200 of this embodiment still can maintain a high linearity required by the system.

In addition, in one embodiment of the instant disclosure, the output-stage circuit 120 further comprises an inductor L, and capacitors C2 and C3. One terminal of the capacitor C2 is connected to a base of the third transistor Q3, and another terminal of the capacitor C2 is connected to a RF input signal RFIN. The inductor L is connected between a system voltage VCC and a collector of the third transistor Q3. One terminal of the capacitor C3 is connected to the collector of the third transistor Q3, and another terminal of the capacitor C3 outputs a RF output signal RFOUT.

When the RF power amplifier 200 has not yet received the RF input signal RFIN, the inductor L shows a low-impedance state, such as a short circuit, to a DC signal, while the capacitors C2 and C3 show a high-impedance state, such as an open circuit, to a DC signal. When the RF power amplifier 200 starts to receive the RF input signal RFIN, the inductor L shows a high-impedance state, such as an open circuit, to a high-frequency signal; while the capacitors C2 and C3 show a low-impedance state, such as a short circuit, to a high-frequency signal. Accordingly, the RF power amplifier 200 operates smoothly in both of the DC working mode and the AC working mode.

[One Embodiment of an Electric System]

Figure 6:
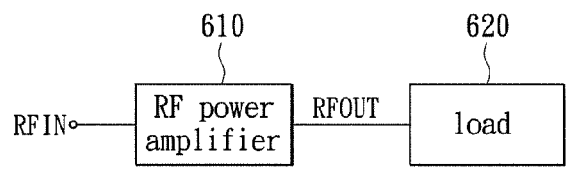
FIG. 6 shows a circuit diagram of a schematic block diagram of an electric system according to an embodiment of the instant disclosure.

Please refer to FIG. 6. FIG. 6 shows a circuit diagram of a schematic block diagram of an electric system according to an embodiment of the instant disclosure. The electric system 600 comprises a RF power amplifier 610 and a load 620. The RF power amplifier 610 receives a RF input signal RFIN and outputs a RF output signal RFOUT to the load 620, in other words, after the RF power amplifier 610 is connected to the system voltage, it provides a stable output power to the load

620. The RF power amplifier 610 provides a stable output power for the load and may be the RF power amplifier 100 of the embodiment shown in FIG. 1 or the RF power amplifier 200 of the embodiment shown in FIG. 2. The electric system 600 may be a system inside any kind of electric devices, such as a portable device, a mobile device and the like.

[One Embodiment of a Method for Self-Adjusting Bias Point]

Figure 7:
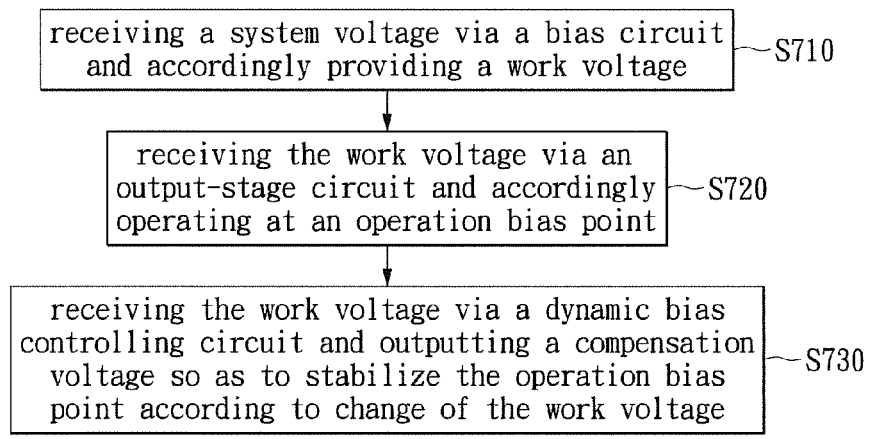
FIG. 7 shows a flow chart of a method for self-adjusting bias point according to an embodiment of the instant disclosure.

Please refer to FIG. 7. FIG. 7 shows a flow chart of a method for self-adjusting bias point according to an embodiment of the instant disclosure. The method of this embodiment may be conducted in the RF power amplifiers shown in FIGS. 1 and 2, and thus please refer to FIGS. 1 and 2 for further understanding. The method for self-adjusting bias point include steps as follows: receiving a system voltage via a bias circuit and accordingly providing a work voltage (S710); receiving the work voltage via an output-stage circuit and accordingly operating at an operation bias point (S720); and receiving the work voltage via a dynamic bias controlling circuit and outputting a compensation voltage so as to stabilize the operation bias point according to change of the work voltage (S730). When the work voltage decreases such that the operation bias point offsets, the work voltage is increased by the bias circuit according to the compensation voltage received so as to recover the operation bias point.

As for the relevant details of the steps of the method for self-adjusting bias point, there is detailed instruction in the embodiments of the FIGS. 1 and 2, and thus it is not repeated thereto. It is to be clarified that a sequence of the steps of the embodiment in FIG. 7 is simply for a need to easily instruct, and the sequence of the steps is not used as a limit condition in demonstrating the embodiments of the instant disclosure.

To sum up, in the electronic system, the RF power amplifier, and the method for self-adjusting bias point provided by the instant disclosure, when the input power of the RF input signal increases, the gain compression resulted from the fact that the operation bias point of the RF power amplifier offsets into a cut-off region can be avoided so as to prevent the output power from being saturated. In other words, the instant disclosure dynamically controls the operation bias point of the RF power amplifier so as to decrease the offset resulted from a change of the input power.

At least one of the embodiments of the instant disclosure can improve the linearity of the RF power amplifier during the power transformation so as to decrease the signal distortion and provide a high working efficiency and a high linearity in order to be satisfied with the system requirements.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A RF power amplifier, receiving and amplifying a RF input signal, comprising:
    a bias circuit, receiving a system voltage and the bias circuit providing a work voltage according to the system voltage;
    an output-stage circuit, electrically connected to the bias circuit, and the output-stage circuit receiving the work voltage for operating at an operation bias point;
    a dynamic bias controlling circuit, receiving the work voltage and outputting a compensation voltage to the bias circuit according to a change of the work voltage;
    a first transistor, having a base connected to the dynamic bias controlling circuit and receiving the compensation voltage, and an emitter connected to the ground voltage;
    a second transistor, having a base connected to a collector of the first transistor and a collector connected to the system voltage;
    a reference current source, having one terminal connected to the collector of the first transistor and another terminal connected to the system voltage so as to provide a reference current;
    a first resistor, having one terminal connected to an emitter of the second transistor and another terminal connected to the dynamic bias controlling circuit; and
    a second resistor, having one terminal connected to the emitter of the second transistor and another terminal connected to the dynamic bias controlling circuit so as to output the work voltage;
    wherein when an input power of the RF input signal increases such that the work voltage decreases and the operation bias point offsets, the work voltage is increased by the bias circuit according to the compensation voltage received so as to recover the operation bias point; and
    wherein the reference current is equal to a sum of a collector current of the first transistor and a base current of the second transistor.

2. The RF power amplifier according to claim 1, wherein when the input power increases such that the work voltage decreases, the base of the first transistor receives the compensation voltage and accordingly the base current and the collector current of the first transistor decrease, such that the base current and the emitter current of the second transistor increase so as to increase the work voltage and recover the operation bias point.

3. The RF power amplifier according to claim 1, wherein the output-stage circuit comprising:
    a third transistor, having a base for receiving the work voltage, an emitter connected to the ground voltage, and a collector connected to the system voltage.

4. The RF power amplifier according to claim 1, wherein the dynamic bias controlling circuit comprising:
    a third resistor, having one terminal connected between the bias circuit and the output-stage circuit, and the third resistor receiving the work voltage; and
    a first capacitor, having one terminal connected to another terminal of the third resistor, and another terminal connected to the ground voltage.

5. An electronic system, comprising:
    a RF power amplifier according to claim 1, receiving a RF input signal and outputting a RF output signal; and
    a load, connected to the RF power amplifier, and the load receiving the RF output signal;
    wherein when the RF input signal increases, the RF power amplifier stabilizes the operation bias point via the compensation circuit.

6. The electronic system according to claim 5, wherein when the input power increase such that the work voltage decrease, the base of the first transistor receives the compensation voltage so that base current and collector current of the first transistor decrease, and thus base current and emitter current of the second transistor increase so as to increase the work voltage for recovering the operation bias point.

7. The electronic system according to claim 5, wherein the dynamic bias controlling circuit comprising:

a third resistor, having one terminal connected between the bias circuit and the output-stage circuit, receiving the work voltage; and a first capacitor, having one terminal connected to another terminal of the third resistor and another terminal connected to the ground voltage.

8. A method for self-adjusting bias point, comprising:

receiving a system voltage via a bias circuit and accordingly providing a work voltage;

receiving the work voltage via an output-stage circuit and accordingly operating at an operation bias point; and receiving the work voltage via a dynamic bias controlling circuit and outputting a compensation voltage so as to stabilize the operation bias point according to change of the work voltage;

wherein when the input power increases and the work voltage decreases such that the operation bias point offsets, the work voltage is increased by the bias circuit via the compensation voltage received so as to recover the operation bias point;

wherein the method for self-adjusting bias point is used in the RF power amplifier according to claim 1.

9. The method for self-adjusting bias point according to claim 8, wherein when the input power increases and the work voltage decreases such that the operation bias point offsets, the bias circuit increases the work voltage based on the compensation voltage received in order to recover the operation bias point.

* * * * *